(12) United States Patent
Maekawa et al.

(10) Patent No.: US 6,351,834 B1
(45) Date of Patent: Feb. 26, 2002

(54) APPARATUS FOR TESTING SEMICONDUCTOR DEVICE

(75) Inventors: Michio Maekawa, Osaka; Junichi Hirase, Kyoto, both of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/407,898

(22) Filed: Sep. 29, 1999

(30) Foreign Application Priority Data

Nov. 10, 1998 (JP) .......................... 10-318714

(51) Int. Cl.[7] .................. G11C 29/00; G01R 31/28; G06F 11/00
(52) U.S. Cl. .................. 714/718; 714/721; 714/735; 714/736; 324/765; 365/201
(58) Field of Search ................ 714/718, 726, 714/733, 734, 735, 736, 738, 721; 324/73.1, 765; 365/201, 233

(56) References Cited

U.S. PATENT DOCUMENTS

| | | | | |
|---|---|---|---|---|
| 4,335,457 A | * | 6/1982 | Early ........................ 714/745 |
| 4,631,724 A | * | 12/1986 | Shimizu ..................... 714/718 |
| 4,710,704 A | * | 12/1987 | Ando ....................... 324/103 R |
| 4,821,238 A | * | 4/1989 | Tatematsu ................... 365/201 |
| 5,266,894 A | * | 11/1993 | Takagi et al. ............... 324/765 |

* cited by examiner

Primary Examiner—Emmanuel L. Moise
(74) Attorney, Agent, or Firm—Eric J. Robinson; Nixon Peabody LLP

(57) ABSTRACT

A plurality of testing units, each of which is applied to an input or output terminal of a device under test, are provided. An input pattern is supplied to a first testing unit that is applied to an input terminal, while expected patterns are supplied to second and third testing units that are applied to first and second output terminals, respectively. These testing units are operated in synchronism with a common clock signal. The second testing unit, which has received the expected pattern, communicates an evaluative result, indicating a point in time when the logical level of a voltage signal appearing at the first output terminal of the device under test matches with the expected pattern, to the third testing unit. And the third testing unit performs timing and functional tests on a signal appearing at the second output terminal with reference to this evaluative result.

5 Claims, 7 Drawing Sheets

|  | X | Y | Z |
|---|---|---|---|
| P1 | 1 | ML | MP |
| P2 | 0 | MH | MN |
| P3 | 1 | ML | MP |
| P4 | 1 | L | H |
| P5 | 0 | MH | MN |
| P6 | 0 | H | L |

Fig. 8

|  | X | Y | Z |
|---|---|---|---|
| P1 | 1 | ML | P |
| P2 | 0 | MH | N |
| P3 | 1 | ML | P |
| P4 | 1 | L | H |
| P5 | 0 | MH | N |
| P6 | 0 | H | L |

Fig. 9

|  | X | Y | Z |
|---|---|---|---|
| P1 | 1 | L | H |
| P2 | 0 | H | L |
| P3 | 1 | L | H |
| P4 | 1 | L | H |
| P5 | 0 | H | L |
| P6 | 0 | H | L |

APPARATUS FOR TESTING SEMICONDUCTOR DEVICE

BACKGROUND OF THE INVENTION

The present invention relates to automatic test equipment (ATE) for semiconductor devices.

A semiconductor device with built-in logic circuits is not shipped as a good product until the device has passed all types of tests including DC, AC and functional tests. A principal item under the AC test, which is also called a "timing test", is checking a signal propagation delay. When the functional test is carried out, a particular signal pattern is applied to an input terminal of a device under the test, thereby verifying whether a pattern appearing at an output terminal of the device is as expected.

SUMMARY OF THE INVENTION

An object of the present invention is carrying out a timing test using a circuit configuration usually applied for a functional test.

To achieve this object, an apparatus for testing a semiconductor device according to the present invention includes: a clock generator for generating a clock signal; a controller for controlling the overall operation of the testing apparatus in synchronism with the clock signal; a pattern generator for generating input and expected patterns in accordance with an instruction given by the controller; and a plurality of testing units, each of which is applied to an input or output terminal of the semiconductor device. Each of these testing unit includes: an input voltage generator for generating a voltage signal to be applied to the input terminal of the semiconductor device based on the input pattern; an output voltage comparator for determining a logical level of the voltage signal appearing at the output terminal of the semiconductor device; a logic comparator for checking whether or not the logical level determined by the output voltage comparator matches with the expected pattern; a switch for selecting either a signal path leading from the input voltage generator to the semiconductor device or a signal path leading from the semiconductor device to the output voltage comparator; and a timing generator for generating a timing signal synchronized with the clock signal in accordance with an instruction given by the controller and for supplying the timing signal generated to the input voltage generator or the output voltage comparator.

BRIEF DESCRIPTION OF THE DRAWINGS

FIG. 8 is a table illustrating another exemplary program for the controller shown in FIG. 3.

FIG. 9 is a table illustrating still another exemplary program for the controller shown in FIG. 3.

DETAILED DESCRIPTION OF THE INVENTION

Hereinafter, embodiments of the present invention will be described with reference to the accompanying drawings.

Figures 1, 7:
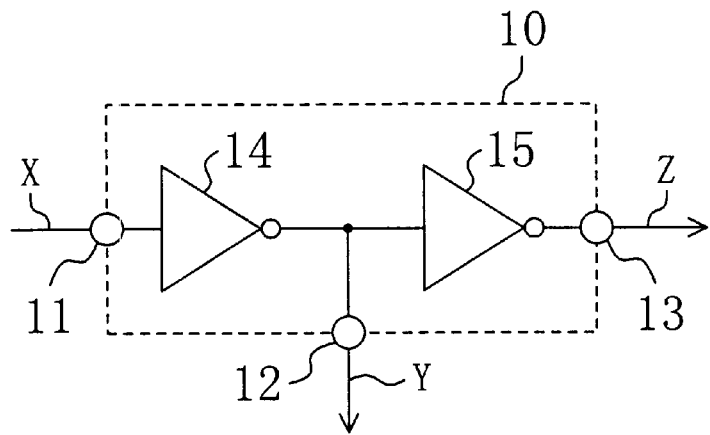
FIG. 1 is a circuit diagram illustrating an exemplary device to be tested by automatic test equipment according to the present invention.
FIG. 7 is a table illustrating an exemplary program for the controller shown in FIG. 3.

FIG. 1 illustrates an exemplary device to be tested by automatic test equipment according to the present invention. For illustrative purposes, the semiconductor device 10 shown in FIG. 1 is supposed to have a very simple configuration. Specifically, the device 10 includes one input terminal 11 and first and second output terminals 12 and 13. First and second inverters 14 and 15 are interposed between the input terminal 11 and the first output terminal 12 and between the first and second output terminals 12 and 13, respectively. A voltage signal Y at the first output terminal 12 is obtained by inverting a voltage signal X at the input terminal 11, and a voltage signal Z at the second output terminal 13 is obtained by inverting the signal Y.

Figure 2:
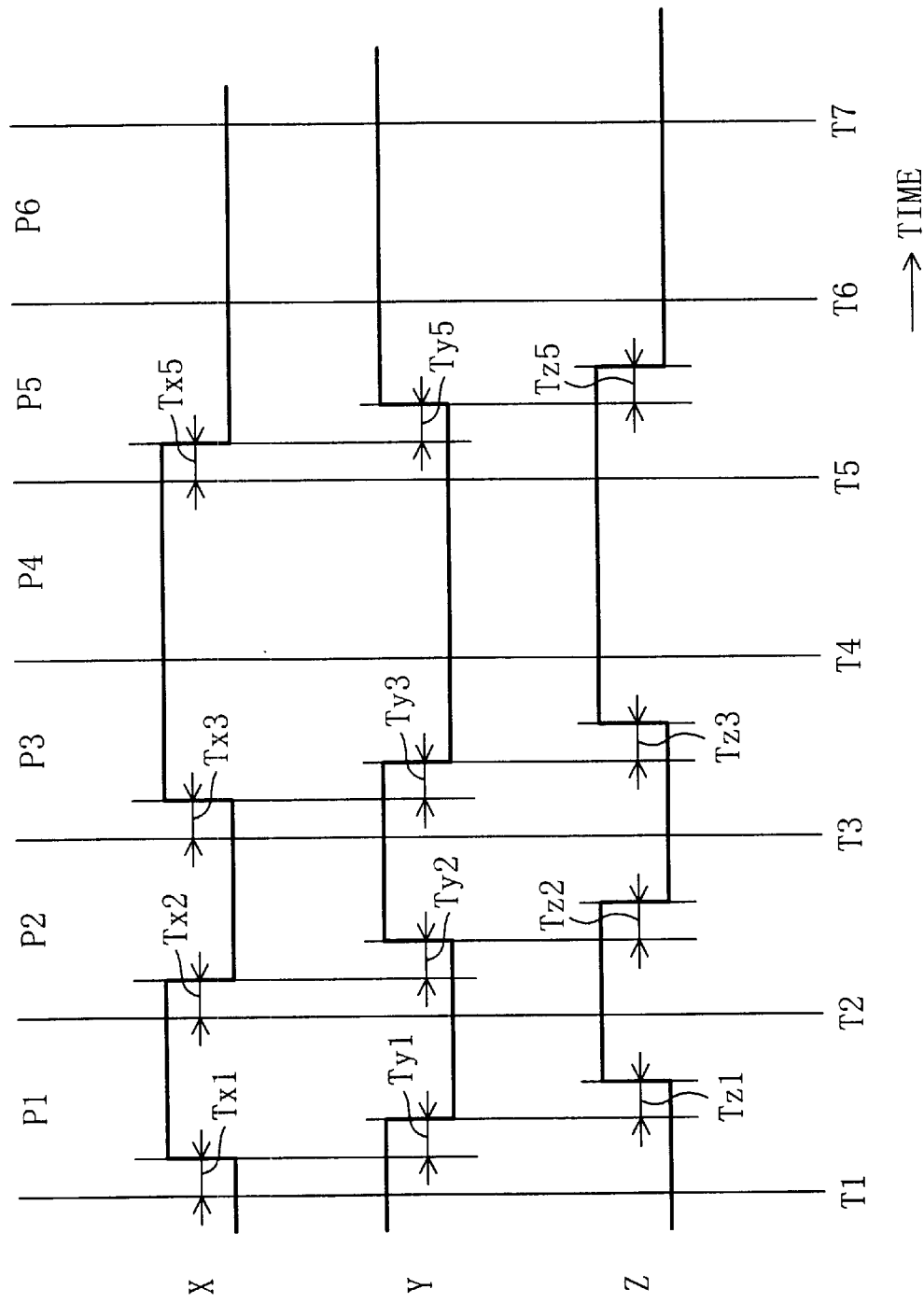
FIG. 2 is a chart illustrating exemplary waveforms of input and output signals of the device shown in FIG. 1.

FIG. 2 illustrates exemplary waveforms of the input and output signals of the semiconductor device 10 shown in FIG. 1. In FIG. 2, P1, P2, P3, P4, P5 and P6 denote first, second, third, fourth, fifth and sixth periods, respectively. In the first period P1 between times T1 and T2, the signal X rises at a point in time later than the time T1 by an interval Tx1. The signal Y falls at a point in time later than the leading edge of the signal X by an interval Ty1. And the signal Z rises at a point in time later than the trailing edge of the signal Y by an interval Tz1. In the second period P2 between times T2 and T3, the signal X falls at a point in time later than the time T2 by an interval Tx2. The signal Y rises at a point in time later than the trailing edge of the signal X by an interval Ty2. And the signal Z falls at a point in time later than the leading edge of the signal Y by an interval Tz2. In the third period P3 between times T3 and T4, the signal X rises at a point in time later than the time T3 by an interval Tx3. The signal Y falls at a point in time later than the leading edge of the signal X by an interval Ty3. And the signal Z rises at a point in time later than the trailing edge of the signal Y by an interval Tz3. During the fourth period P4 between times T4 and T5, the signal X is held logically high (i.e., at "H" level) and the signals Y and Z are held logically low and high (i.e., at "L" and "H" levels), respectively. In the fifth period P5 between times T5 and T6, the signal X falls at a point in time later than the time T5 by an interval Tx5. The signal Y rises at a point in time later than the trailing edge of the signal X by an interval Ty5. And the signal Z falls at a point in time later than the leading edge of the signal Y by an interval Tz5. During the sixth period P6 between times T6 15 and T7, the signal X is held logically low and the signals Y and Z are held logically high and low, respectively. In carrying out a functional test on the semiconductor device 10, where the signal X having such a pattern as that illustrated in FIG. 2 is applied to the input terminal 11, it is determined whether or not the patterns of the signals Y and Z change as expected. Also, in performing a timing test on the semiconductor device 10, the signal propagation delay at the second inverter 15, i.e., the interval Tz1, Tz2, Tz3 or Tz5, is shorter than a predetermined time thereof, for example.

Figure 3:
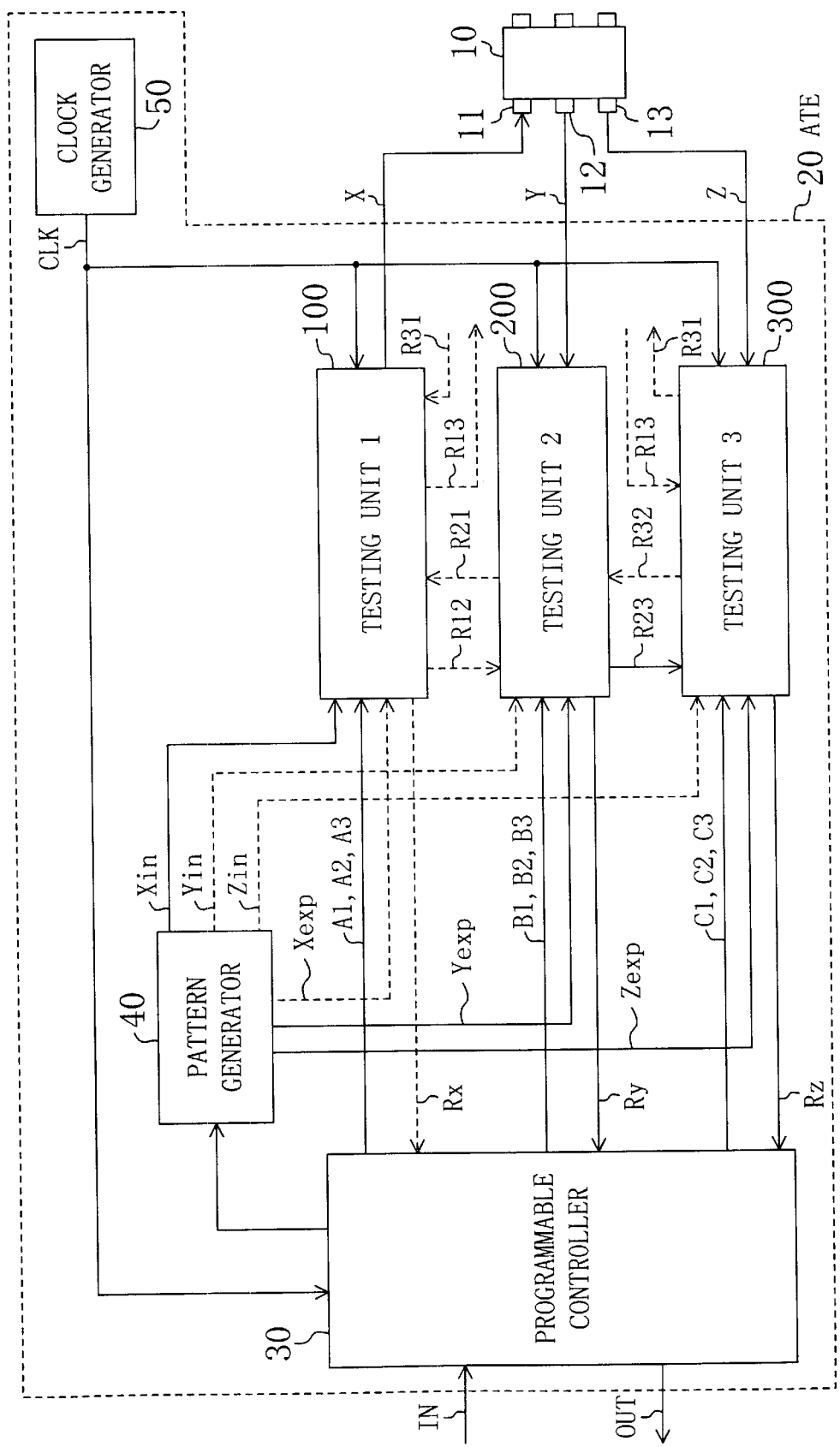
FIG. 3 is a block diagram illustrating an exemplary configuration for the automatic test equipment according to the present invention.

FIG. 3 illustrates an exemplary configuration for automatic test equipment (ATE) 20 according to the present invention. The ATE 20 shown in FIG. 3 includes programmable controller 30, pattern generator 40, clock generator 50 and first, second and third testing units 100, 200 and 300. The first, second and third testing units 100, 200 and 300 are respectively applied to the input terminal 11, first output terminal 12 and second output terminal 13 of the device 10 under test shown in FIG. 1. The clock generator 50 generates a clock signal CLK and supplies the clock signal CLK to the controller 30 and the first, second and third testing units 100, 200 and 300. The leading edges of the clock signal CLK define the times T1 through T6 shown in FIG. 2, at which respective periods P1 through P6 start. The controller 30 controls the overall operation of the ATE in synchronism with the clock signal CLK, receives a program, for example, through an input port IN and communicates a test result through an output port OUT. The pattern generator 40 generates an input pattern Xin and expected patterns Yexp and Zexp for the device 10 under test in accordance with an instruction given by the controller 30. The first, second and third testing units 100, 200 and 300 receive the input pattern Xin, expected pattern Yexp and expected pattern Zexp, respectively. In the illustrated example, the other input patterns Yin and Zin and the other expected pattern Xexp are all disabled. The first testing unit 100 also receives timer control information items A1, A2 and A3 from the controller 30 and supplies the signal X, which is associated with the input pattern Xin, to the input terminal 11 of the device 10 under test. The second testing unit 200 receives timer control information items B1, B2 and B3 from the controller 30, detects the signal Y appearing at the first output terminal 12 of the device 10, and communicates an evaluative result Ry associated with the signal Y to the controller 30. The third testing unit 300 receives timer control information items C1, C2 and C3 from the controller 30, detects the signal Z appearing at the second output terminal 13 of the device 10, and communicates an evaluative result Rz associated with the signal Z to the controller 30. In the illustrated example, the other evaluative result Rx is disabled. Also, R12, R23, R31, R21, R32 and R13 denote respective reference information items exchanged among these testing units. In performing a timing test on the signal propagation delay at the second inverter 15, all the reference information items but one R23 are disabled.

Figure 4:
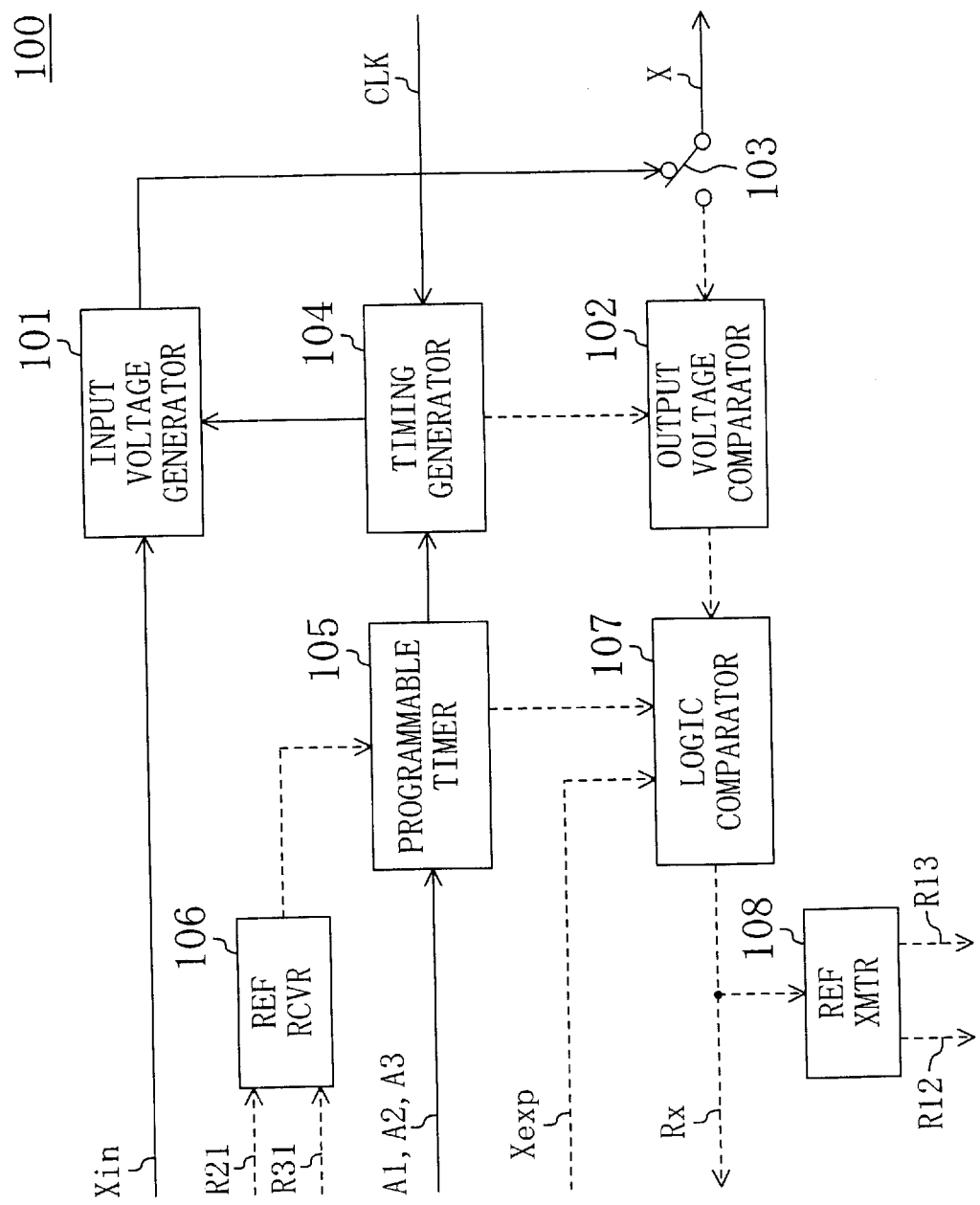
FIG. 4 is a block diagram illustrating an internal configuration for the first testing unit shown in FIG. 3.

FIG. 4 illustrates an internal configuration for the first testing unit 100 shown in FIG. 3. The first testing unit 100 includes input voltage generator 101, output voltage comparator 102, switch 103, timing generator 104, programmable timer 105, reference receiver (REF RCVR) 106, logic comparator 107 and reference transmitter (REF XMTR) 108. The switch 103 selects a signal path leading from the input voltage generator 101 to the device 10 under test. The input voltage generator 101 generates the signal X to be applied to the input terminal 11 of the device 10 under test based on the input pattern Xin. The timing generator 104 generates a timing signal synchronized with the clock signal CLK in accordance with an instruction given by the controller 30, and supplies the timing signal generated to the input voltage generator 101. The timer 105 keeps time so as to control the generation of the timing signal by the timing generator 104 in accordance with the timer control information items A1, A2 and A3 received from the controller 30. In the illustrated example, the output voltage comparator 102, reference receiver 106, logic comparator 107 and reference transmitter 108 are all disabled.

Figure 5:
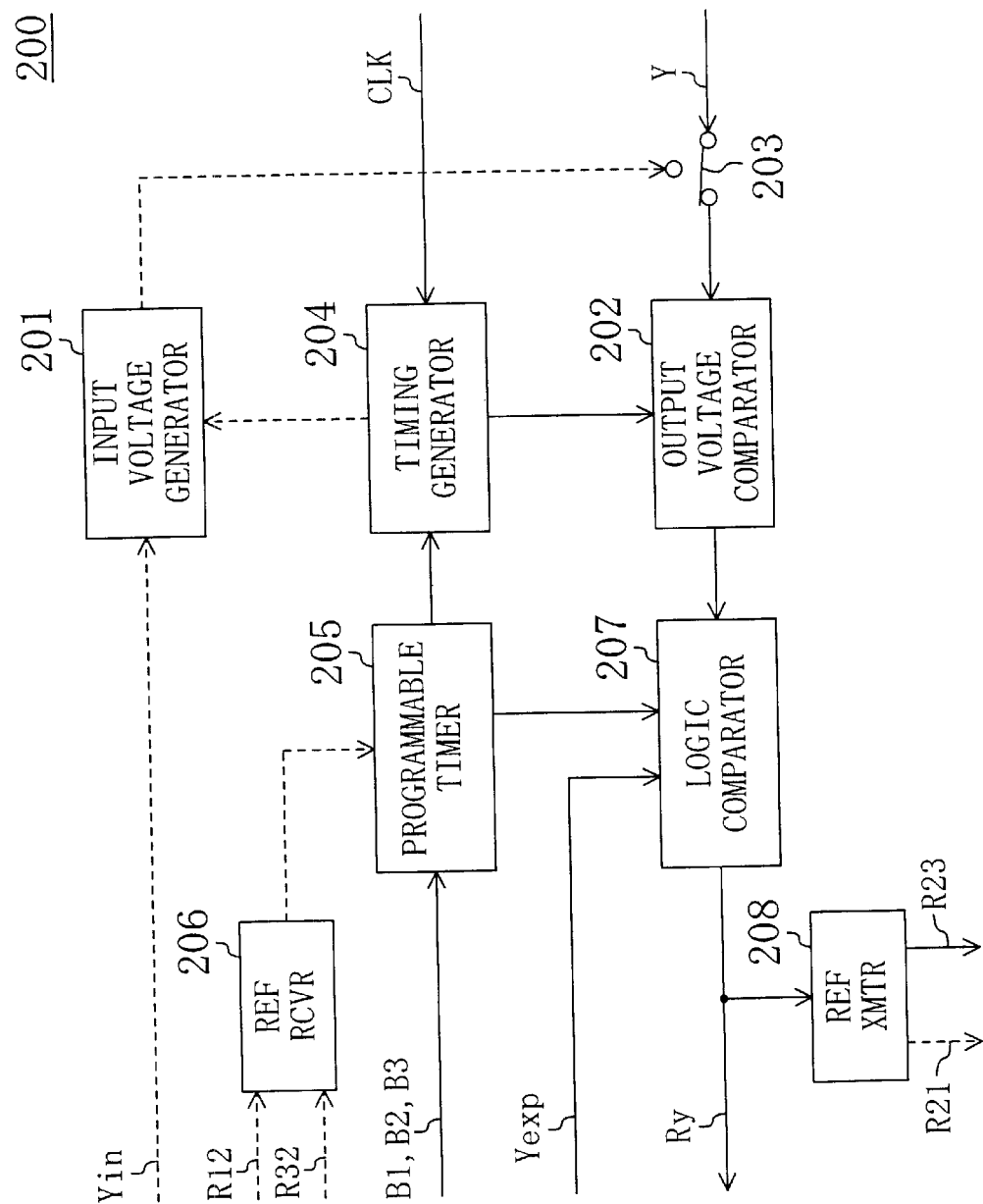
FIG. 5 is a block diagram illustrating an internal configuration for the second testing unit shown in FIG. 3.

FIG. 5 illustrates an internal configuration for the second testing unit 200 shown in FIG. 3. Like the first testing unit 100, the second testing unit 200 also includes input voltage generator 201, output voltage comparator 202, switch 203, timing generator 204, programmable timer 205, reference receiver 206, logic comparator 207 and reference transmitter 208. The switch 203 selects a signal path leading from the device 10 under test to the output voltage comparator 202. The output voltage comparator 202 determines the logical level of the signal Y appearing at the first output terminal 12 of the device 10 under test. The timing generator 204 generates a timing signal synchronized with the clock signal CLK in accordance with an instruction given by the controller 30 and supplies the timing signal generated to the output voltage comparator 202. The timer 205 keeps time so as to control the generation of the timing signal by the timing generator 204 in accordance with the timer control information items B1, B2 and B3 received from the controller 30. The logic comparator 207 supplies the evaluative result Ry indicating a point in time when the logical level determined by the output voltage comparator 202 matches with the expected pattern Yexp. The reference transmitter 208 supplies the reference information item R23 representing the evaluative result Ry to the third testing unit 300. In the illustrated example, the input voltage generator 201 and reference receiver 206 are both disabled.

Figure 6:
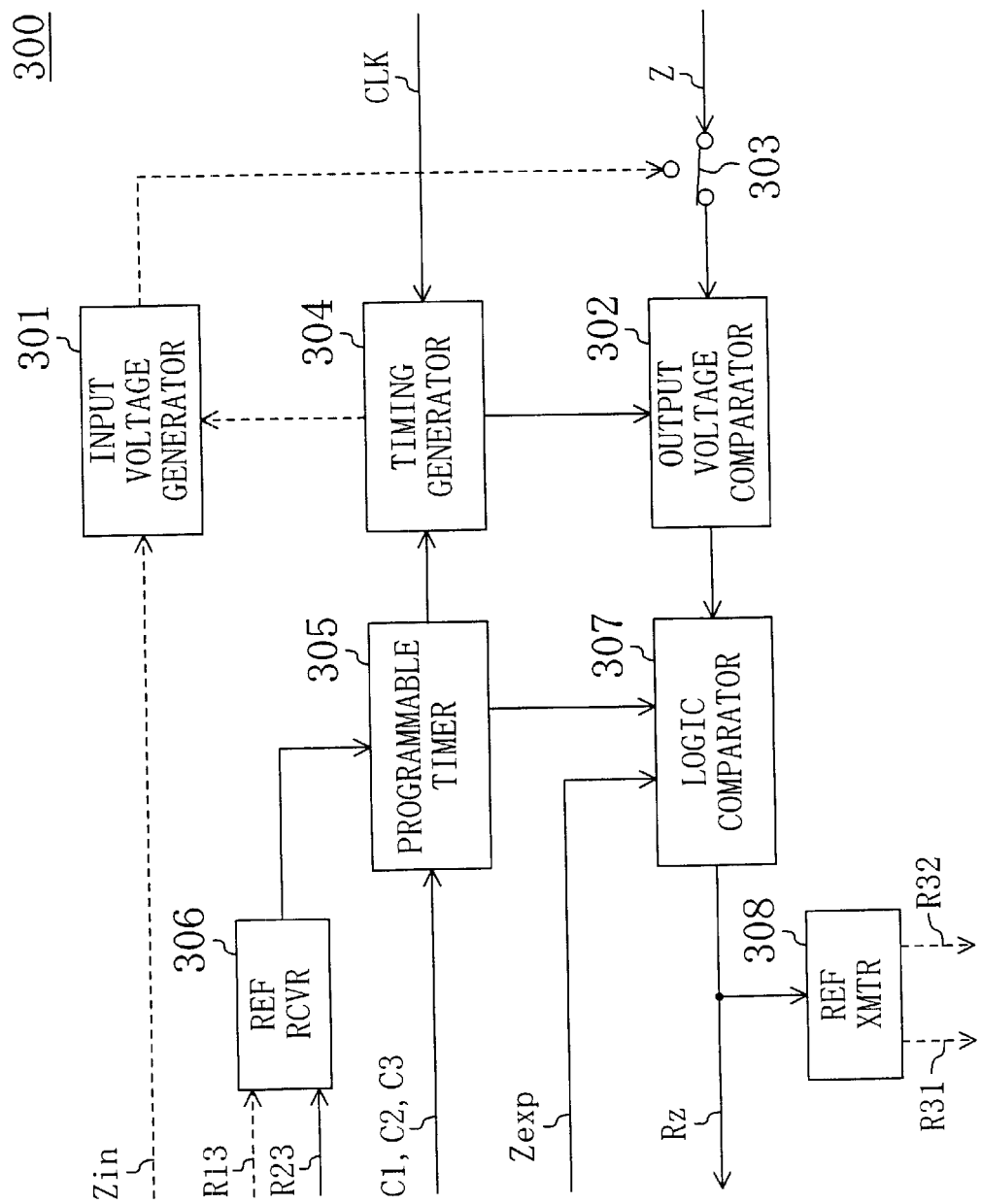
FIG. 6 is a block diagram illustrating an internal configuration for the third testing unit shown in FIG. 3.

FIG. 6 illustrates an internal configuration for the third testing unit 300 shown in FIG. 3. Like the first and second testing units 100 and 200, the third testing unit 300 also includes input voltage generator 301, output voltage comparator 302, switch 303, timing generator 304, programmable timer 305, reference receiver 306, logic comparator 307 and reference transmitter 308. The switch 303 selects a signal path leading from the device 10 under test to the output voltage comparator 302. The output voltage comparator 302 determines the logical level of the signal Z appearing at the second output terminal 13 of the device 10 under test. The timing generator 304 generates a timing signal synchronized with the clock signal CLK in accordance with an instruction given by the controller 30 and supplies the timing signal generated to the output voltage comparator 302. The timer 305 keeps time so as to control the generation of the timing signal by the timing generator 304 in accordance with the timer control information items C1, C2 and C3 received from the controller 30. The reference receiver 306 receives the reference information R23 representing the evaluative result Ry from the second testing unit 200 and notifies the timer 305 that the information received should be a time base. The logic comparator 307 supplies the evaluative result Rz indicating a point in time when the logical level determined by the output voltage comparator 302 matches with the expected pattern Zexp. In the illustrated example, the input voltage generator 301 and reference transmitter 308 are both disabled.

FIG. 7 illustrates an exemplary program for the controller 30 shown in FIG. 3. In FIG. 7, the columns of "X", "Y" and "Z" represent the input pattern X in (see FIG. 2), expected pattern Yexp and expected pattern Zexp, respectively. Hereinafter, the operation of the ATE 20 will be described with reference to FIG. 2.

An instruction for the first period P1 is "X=1, Y=ML and Z=MP". Responsive to "X=1", the input voltage generator 101 makes the signal X rise. The interval Tx1 between the time T1 and the rise time of the signal X is specified by the timer control information item A1. The output voltage comparator 202 and logic comparator 207 examine several times whether or not the signal Y has become logically low. This will be called "edge search operations of the signal Y". A point in time when the edge search is started, an interval between the search operations and a maximum number of times that the search operations can be performed are specified by the timer control information items B1, B2 and B3, respectively. By performing these edge search operations, the evaluative result Ry representing the fall time of the signal Y is obtained. And this result Ry is communicated to the timer 305. The output voltage comparator 302 and logic comparator 307 perform evaluations of a functional test by determining, based on the fall time of the signal Y, whether or not a positive edge of the signal Z has been caused. This functional test is started at a point in time when the evaluation of a timing test should be carried out. The interval between the fall time of the signal Y and the time when the timing test evaluation should be carried out is specified by the timer control information item C1. Also, an interval between the functional test evaluations is specified by the timer control information item C2. A maximum number of times that the functional test evaluations can be performed is specified by the timer control information item C3.

An instruction for the second period P2 is "X=0, Y=MH and Z=MN". The input voltage generator 101 makes the signal X fall. Under the control of the timer 205, the output voltage comparator 202 and logic comparator 207 search for an edge on which the signal Y changes from "L" into "H" level. By performing this search operation, the evaluative result Ry representing the rise time of the signal Y is obtained. And this result Ry is communicated to the timer 305. The output voltage comparator 302 and logic comparator 307 perform evaluations of a functional test by determining, based on the rise time of the signal Y, whether or not a negative edge of the signal Z has been caused. This functional test is started at a point in time when the evaluation of a timing test should be carried out.

An instruction for the third period P3 is the same as that for the first period P1.

An instruction for the fourth period P4 is "X=1, Y=L and Z=H". The input voltage generator 101 holds the signal X logically high. The output voltage comparator 202 and logic comparator 207 check just once whether or not the signal Y is held at the "L" level at a point in time that has been specified based on the time T4 by the timer control information item B1. The output voltage comparator 302 and logic comparator 307 check just once whether or not the signal Z is held at the "H" level at a point in time that has been specified based on the time T4 by the timer control information item C1.

An instruction for the fifth period P5 is the same as that for the second period P2.

An instruction for the sixth period P6 is "X=0, Y=H and Z=L". The input voltage generator 101 holds the signal X logically low. The output voltage comparator 202 and logic comparator 207 check just once whether or not the signal Y is held at the "H" level. The output voltage comparator 302 and logic comparator 307 check just once whether or not the signal Z is held at the "L" level.

As can be seen, according to the program shown in FIG. 7, the functional test is carried out in parallel with the timing test of the device 10 under test. In addition, the controller 30 controls the timing generator 304 via the timer 305 such that the functional test evaluations are carried out on and after the point in time when the timing test evaluation is carried out. Accordingly, a device, which has turned out to be no good as a result of the timing test but good as a result of the functional test, can be sorted out.

FIG. 8 illustrates another exemplary program for the controller 30 shown in FIG. 3. Unlike the program shown in FIG. 7, "Z=P" in the first and third periods P1 and P3 and "Z=N" in the second and fifth periods P2 and P5 in the program shown in FIG. 8. According to the program shown in FIG. 8, the output voltage comparator 302 and logic comparator 307 perform the evaluation of a functional test by determining, based on the fall time of the signal Y, whether or not a positive edge of the signal Z has been caused. This functional test evaluation is carried out just once during the first period P1 at a point in time when the evaluation of a timing test should be carried out. The interval between the fall time of the signal Y and the time when the functional and timing test evaluations should be carried out is specified by the timer control information item C1. In the second period P2, the output voltage comparator 302 and logic comparator 307 perform the evaluation of a functional test by determining, based on the rise time of the signal Y, whether or not a negative edge of the signal Z has been caused. This functional test evaluation is carried out just once during the second period P2 at a point in time when the evaluation of a timing test should be carried out.

According to the program shown in FIG. 8, the functional test is carried out in parallel with the timing test of the device 10 under test. In addition, the controller 30 controls the timing generator 304 via the timer 305 such that the functional test evaluation is carried out just once at the same point in time when the timing test evaluation is carried out. Accordingly, this program is effectively applicable to a situation where the functional and timing faults of a device need not be distinguished from each other.

FIG. 9 illustrates still another exemplary program for the controller 30 shown in FIG. 3. After a functional test has been carried out by the ATE 20 in accordance with the program shown in FIG. 9, a timing test is carried out by the same ATE 20.

In FIG. 9, an instruction for the first period P1 is "X=1, Y=L and Z=H". The input voltage generator 101 makes the signal X rise. The output voltage comparator 202 and logic comparator 207 perform the evaluation of a functional test by determining, based on the time T1, whether or not the signal Y has become logically low. This functional test evaluation is carried out just once at a point in time specified by the timer control information item B1. The output voltage comparator 302 and logic comparator 307 perform the evaluation of a functional test by determining, based on the time T1, whether or not the signal Z has become logically high. This functional test evaluation is carried out just once at a point in time specified by the timer control information item C1. The functional test will be carried on in a similar manner by the time the sixth period P6 is over.

Subsequently, a timing test is carried out for just one period. In the illustrated example, the same instruction "X=1, Y=ML and Z=P" as that for the first period P1 shown in FIG. 8 is executed. The input voltage generator 101 makes the signal X rise. The output voltage comparator 202 and logic comparator 207 search for an edge on which the signal Y changes from "H" into "L" level. A point in time when the edge search is started, an interval between the search operations and a maximum number of times that the search operations can be performed are specified by the timer control information items B1, B2 and B3, respectively. By performing these edge search operations, the evaluative result Ry representing the fall time of the signal Y is obtained. And this result Ry is communicated to the timer 305. The output voltage comparator 302 and logic comparator 307 perform a timing test of determining, based on the fall time of the signal Y, whether or not a positive edge of the signal Z has been caused. This timing test is carried out at a point in time specified by the timer control information item C1.

It should be noted that a timing test may also be performed without using the reference information items among the testing units. In such a case, an instruction "X=1, Y=ML and Z=MH" is applicable, for example. The output voltage comparator 202 and logic comparator 207 search for an edge on which the signal Y changes from "H" into "L" level. A point in time when the edge search is started, an interval between the search operations and a maximum number of times that the search operations can be performed are specified by the timer control information items B1, B2 and B3, respectively, based on the time Ti. On the other hand, the output voltage comparator 302 and logic comparator 307 search for an edge on which the signal Z changes from "L" into "H" level. A point in time when the edge search is started, an interval between the search operations and a maximum number of times that the search operations can be performed are specified by the timer control information items C1, C2 and C3, respectively, based on the time T1.

Also, a timing test may be performed without using any timer. In such a case, the controller 30 needs to indicate respective times at which edges should be searched for.

The first and second testing units 100 and 200 shown in FIG. 3 are applicable to output and input terminals of another device under test, respectively. In such a case, the output voltage comparator 102, logic comparator 107 and input voltage generator 201 operate. Also, the third testing unit 300 is applicable to an input terminal of the device. A great number of, e.g., more than 100, testing units may be provided. To ensure high timing accuracy for the ATE, these testing units are preferably coupled together via optical fibers.

What is claimed is:

1. An apparatus for testing a semiconductor device, the apparatus comprising:

a clock generator for generating a clock signal;

a controller for controlling the overall operation of the testing apparatus in synchronism with the clock signal;

a pattern generator for generating input and expected patterns in accordance with an instruction given by the controller; and a plurality of testing units, each of which is applied to an input or output terminal of the semiconductor device, wherein each said testing unit includes:

an input voltage generator for generating a voltage signal to be applied to the input terminal of the semiconductor device based on the input pattern;

an output voltage comparator for determining a logical level of the voltage signal appearing at the output terminal of the semiconductor device;

a logic comparator for checking whether or not the logical level determined by the output voltage comparator matches with the expected pattern;

a switch for selecting either a signal path leading from the input voltage generator to the semiconductor device or a signal path leading from the semiconductor device to the output voltage comparator; and a timing generator for generating a timing signal synchronized with the clock signal in accordance with an instruction given by the controller and for supplying the timing signal generated to the input voltage generator or the output voltage comparator.

2. The apparatus of claim 1, wherein each said testing unit further includes a time or keeping time so as to control the generation of the timing signal by the timing generator in accordance with the instruction received from the controller, and wherein the logic comparator of each said testing unit supplies an evaluative result representing a point in time when the logical level determined by the output voltage comparator matches with the expected pattern.

3. The apparatus of claim 2, wherein one of the testing units further includes a reference transmitter for transmitting the evaluative result obtained by the logic comparator, and wherein another one of the testing units further includes a reference receiver for receiving the evaluative result transmitted and for communicating the evaluative result received to the timer as a time base.

4. The apparatus of claim 3, wherein the controller controls the timing generator via the timer such that the evaluation of a functional test is carried out once at the same time with the evaluation of a timing test.

5. The apparatus of claim 3, wherein the controller controls the timing generator via the timer such that evaluations of a functional test are carried out at the same time with the evaluation of a timing test and thereafter.

* * * * *